United States Patent [19]

Miller et al.

[11] 4,196,360
[45] Apr. 1, 1980

[54] INTERFACE DRIVER CIRCUIT

[75] Inventors: Edward B. Miller; Charles W. Eichelberger, both of Schenectady, N.Y.

[73] Assignee: General Electric Company, Schenectady, N.Y.

[21] Appl. No.: 871,991

[22] Filed: Jan. 24, 1978

[51] Int. Cl.² ............... H03K 19/08; H03K 3/42
[52] U.S. Cl. ............... 307/270; 307/DIG. 1; 307/208; 307/311
[58] Field of Search ............ 307/209, 270, 264, 311, 307/208, DIG. 1

[56] References Cited

U.S. PATENT DOCUMENTS

| | | | |
|---|---|---|---|
| 3,602,733 | 8/1971 | Aoki | 307/217 |
| 3,792,292 | 2/1974 | Priel | 307/209 |
| 3,959,665 | 5/1976 | Gilbreath et al. | 307/270 |

OTHER PUBLICATIONS

Electronics, "Making Light of the Noise Problem" by J. Merryman, pp. 52–55, 7/26/65.

Primary Examiner—Stanley D. Miller, Jr.
Assistant Examiner—B. P. Davis
Attorney, Agent, or Firm—Geoffrey H. Krauss; James C. Davis; Marvin Snyder

[57] ABSTRACT

An interface driver circuit, for use in a programmable energy load controller system, comprises a pair of optically-coupled input sections, respectively receiving data and a special signal of digital nature and a first voltage polarity. A buffer amplifier section is coupled to the data input circuit for driving a twisted-wire transmission line, coupled to the paralleled inputs of a plurality of receivers, with logic signals alternating essentially between ground potential and the first voltage at the first polarity; a second amplifier section is enabled by the special signal input section and impresses a voltage of the remaining polarity across the interface driver circuit output when commanded at the special signal input, regardless of the state of the data signal at the first input.

6 Claims, 5 Drawing Figures

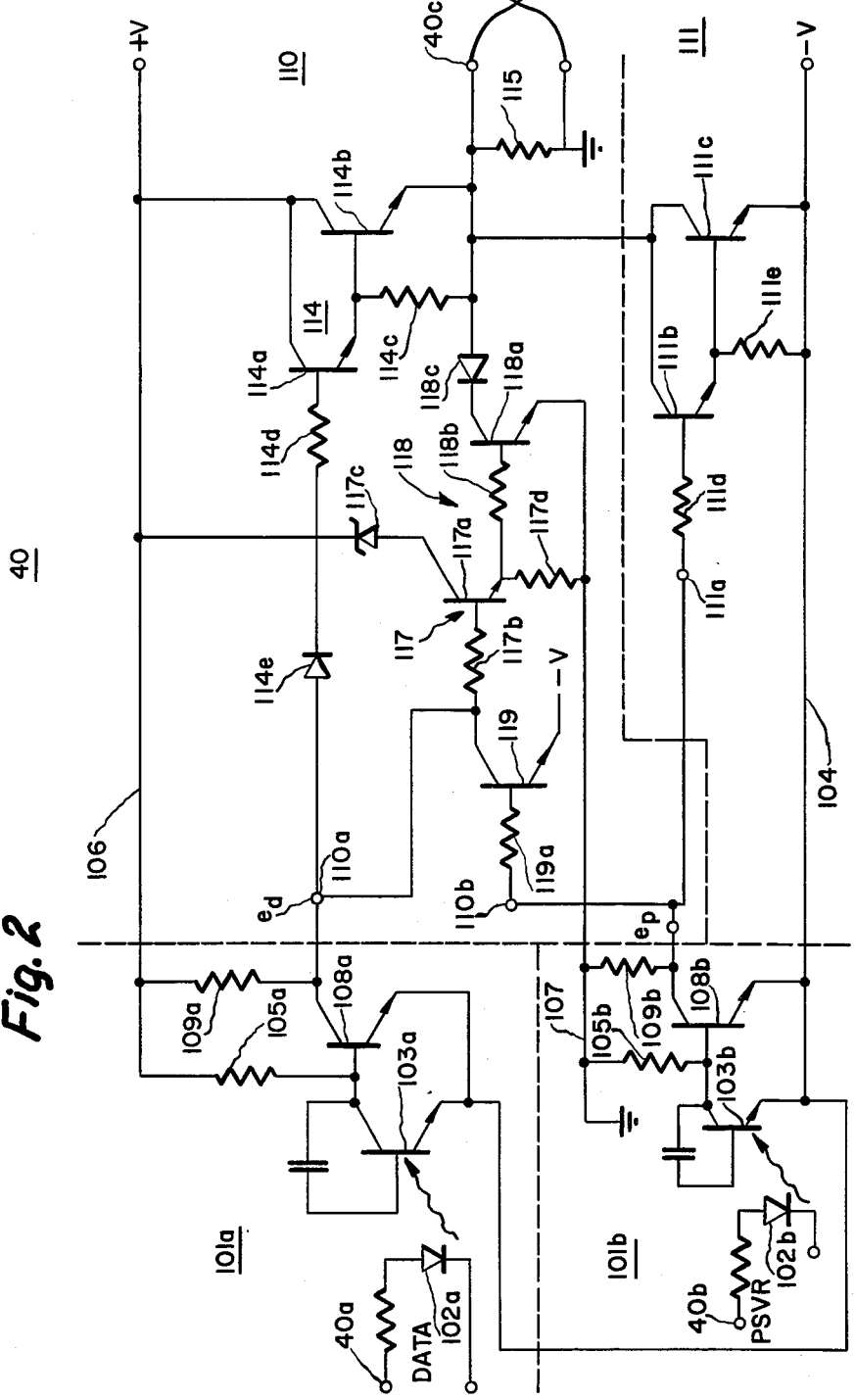

INTERFACE DRIVER CIRCUIT

BACKGROUND OF THE INVENTION

In an automatic system for controlling the energy states of a multiplicity of loads, as more fully described in our co-pending application Ser No. 871,989 filed Jan. 24, 1978 and now superceded by continuation application Ser. No. 966,816, filed Dec. 6, 1978, and incorporated by reference herein, it is necessary to receive data signals from a logic source, typically a microcomputer and the like, and transmit these signals to the paralleled inputs of a plurality of remote receivers, each capable of receiving data concerning the energy utilization condition of a plurality of loads attached thereto. The receivers are also capable of acting upon a special, or power-saver, signal for removing operating voltage from the majority of logic within the receiver, in order to reduce system power consumption to a minimum. An interface driver circuit capable of receiving both the data and special signals, in a logic format having a single voltage polarity, and transmitting these signals on a transmission medium, typically a twisted pair of wires, is desirable with capability for producing data signals alternating between essentially ground potential and the first voltage polarity and the special signal having the remaining voltage polarity.

BRIEF SUMMARY OF THE INVENTION

In accordance with the invention, there is provided a novel interface driver circuit for supplying logic signals, via a two-wire twisted pair, to the paralleled inputs of a multiplicity of receivers, from the input/output (I/O) bus of a microcomputer and the like. The logic signals at the interface output comprise data signals having a first (preferably positive) voltage polarity and at least one special signal having the opposite voltage polarity; both polarity outputs are controlled by input signals of a single polarity.

In a preferred embodiment of our invention, a pair of identical data input circuits respectively receive the data and special, or powersaver, signals and utilize optical coupling techniques therefor. A data buffer-amplifier section receives the output of the input section receiving the data signals for driving the transmission media with binary logic signals alternating between ground potential and the first voltage having a first polarity. A command buffer-amplifier section receives inputs from the output of the second, or special signal, input circuit and has its output coupled in parallel across the interface driver output for providing a signal of the remaining voltage polarity across the circuit output whenever the special signal input is enabled, regardless of the state of the data signal input.

Accordingly, it is an object of this invention to provide a novel interface driver circuit for driving a plurality of receivers with outputs of opposite polarities responsive to associated inputs of a single polarity.

These and other objects of the present invention will become apparent to those skilled in the art upon consideration of the following detailed description taken in conjunction with the drawings.

BRIEF DESCRIPTION OF THE DRAWINGS

FIG. 2 is a schematic diagram of one preferred embodiment of an interface driver circuit in accordance with the principles of the present invention and for use in the system of FIG. 1;

FIG. 3 is an illustration of the transmitted data format used in one embodiment of the system;

DETAILED DESCRIPTION OF THE INVENTION

Figure 1:
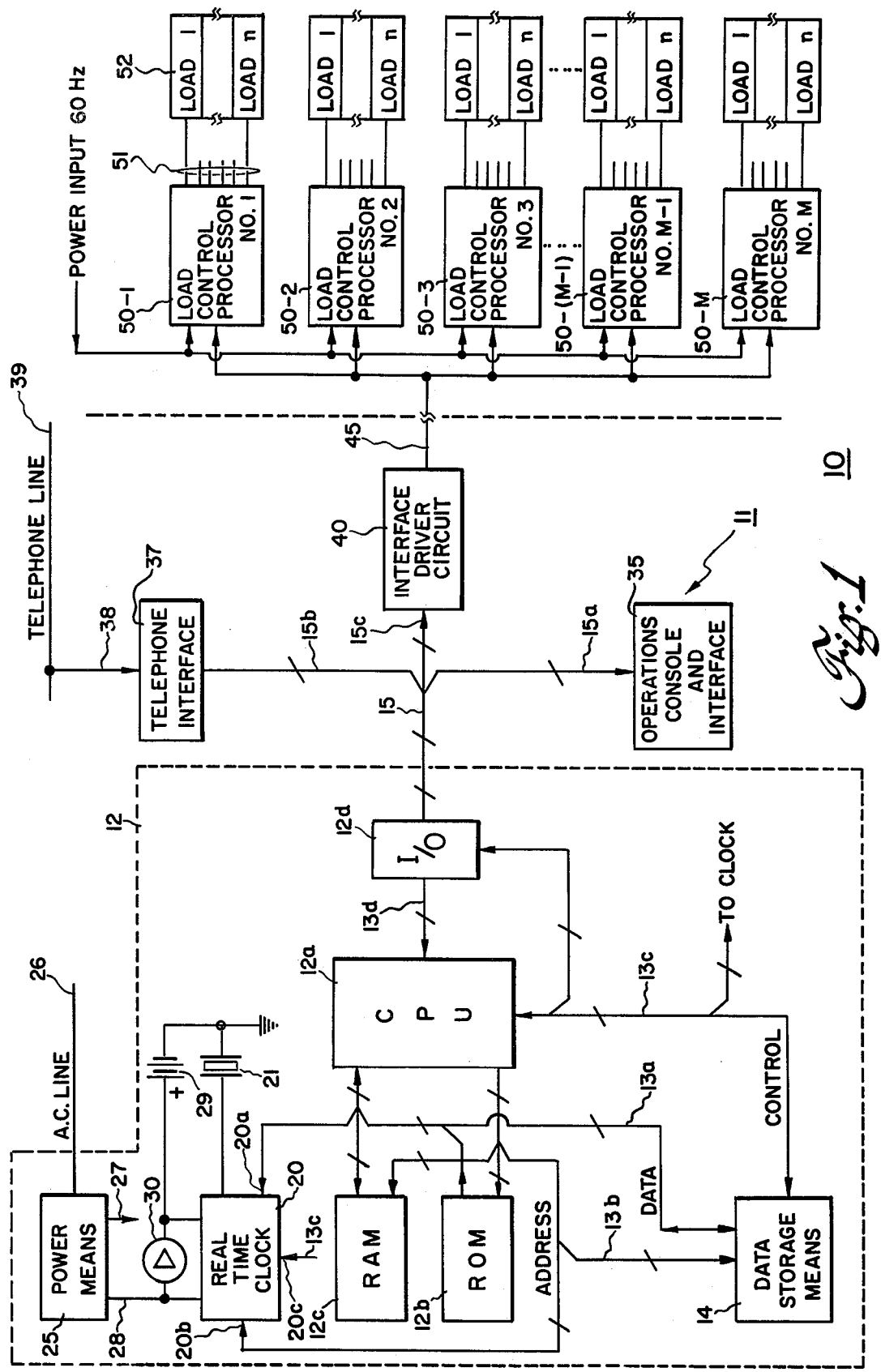
FIG. 1 is a block schematic diagram of a novel programmable energy load controller system.

An overall block diagram is shown in FIG. 1 of one presently preferred embodiment of a programmable energy load controller system 10. A central facility 11, shown generally to the left of the vertical broken line, comprises a microcomputer 12, such as a standard INTEL MDS-800 microcomputer, containing a central processing unit (CPU) 12a; read-only-memory (ROM) means 12b (of about 6kilobyte capacity); read-write random-access-memory (RAM) means 12c (of about 16 kilobyte capacity); and an input/output (I/O) means 12d. The microcomputer also contains suitable multi-wire signal path structures, commonly known as a data bus 13a, an address bus 13b and a control bus 13c, interconnecting the CPU, ROM, I/O and RAM means, and an I/O bus 13d coupling the CPU and I/O means. The various parallel bus structures 13a, 13b and 13c are coupled to a mass data storage means 14, which may be a magnetic tape transport and controller, a magnetic disk, data cassette transport mechanism and the like, for storage of large quantities of data which may be written into and read from data storage means 14 via data bus 13a, under control of CPU 12a. Data storage means 14 may be physically located within microcomputer 12 or adjacent thereto, with proper coupling of the data, address and control buses thereto.

The data bus 13a is of the bidirectional type, whereby data may be read from data storage means 14 into temporary data storage means such as RAM 12c, or vice-versa, under control of CPU 12a and programs executed therein, in manner known to the computing arts. Data may be received in the microcomputer 12 via a parallel and/or serial input bus (or buses) 15 from sources external to the microcomputer.

Also contained within microcomputer 12 is a real-time clock module 20, utilizing a high-stability crystal element 21, to continuously and accurately establish the time-of-day (TOD) and day-of-week (DOW). Real-time clock means 20 is coupled to bidirectional data bus 13a at clock data port 20a, to address bus 13b at clock address port 20b, and to control bus 13c, at clock control port 20c, to facilitate entry of clock starting time data upon energization of the load controller system of the present invention, and to facilitate reading the TOD and DOW data from clock means 20 when the clock means is interrogated with address codes, at port 20b, corresponding to the unique address codes previously assigned to the clock. Real-time clock means 20 is advantageously fabricated upon a printed circuit board, or other like means, of similar size as that used for mounting the components of the other portions of the microcomputer, and the real-time clock means, along with its timing element 21 and a rechargeable battery means 29, is physically positioned within the confines of the microcomputer at the central facility.

A power supply means 25 is coupled to the AC power line 26 in the building housing the central facility and is coupled to the microcomputer 12, via connections 27 and 28, to provide the required operational voltages and currents. DC power connection 28 provides the real-time clock with operating power derived from the commercial power means, and is coupled to a back-up battery 29 via a battery charging circuit 30 which allows charging current to flow easily in the direction of the battery such that in the event that AC mains power is lost for any reason, the battery is isolated from means 25 and remains coupled only to real-time clock 20 to assure that the timekeeping function of the clock is maintained. Upon reestablishment of mains power, a bootstrap program directs the CPU to place on address bus 13b the sequential addresses of the clock portions storing TOD and DOW data such that the system will then implement the load energization pattern required for that particular time.

An operations console and interface 35, such as a General Electric TERMINET 30 ® data terminal and the like, is generally physically located near the central computer and is coupled to the I/O bus via bus portion 15a and thence to I/O means 12d of the computer. Console 35 allows system personnel to load, debug and/or modify system programs as well as perform computer diagnostic routines, as required, and in manner known to the art.

A telephone interface means 37, such as a standard AT&T 407A data set and the like, receives tone-coded serial data, coupled via bus 38 to a telephone line 39, which may be a dedicated telephone number in a building-wide telephone system and the like, and decodes this data prior to coupling the data via a portion 15b of the I/O bus to the computer, in manner known to the art.

The central facility is substantially completed by an interface driver circuit 40 serving to couple a portion 15c of the I/O bus to transmission media 45 serving to carry signals representative of data to and from the central facility and the inputs of each of a plurality of remotely-located load control processors 50-1 through 50-M. Media 45 is preferably a cable running between interface driver 40 and each of the parallel inputs of the load control processors 50. In our preferred embodiment, transmission medium 45 is a pair of twisted wires, although a coaxial cable may be equally as well utilized.

Each load control processor 50 is assigned an address unique to that load control processor (LCP), even if more than one load control processor is physically located at the same location within the facility. Each of load control processors 50, when properly addressed and enabled, decodes function data transmitted from the central facility thereto, for energization of combinations of the LCP output lines 51 to enable or disable one of a plurality (n) of loads 52 coupled to each LCP. Additionally, in our preferred embodiment, each LCP is configured to not only enable and disable energy consumption by one of the n loads coupled thereto, but also, when our energy load controller system is utilized for controlling lighting functions and the like, to enable each lighting load (a single fixture, bulb and the like) to one of a plurality of different energized conditions. Thus, where a single lighting fixture contains a lighting load capable of being switched between the "off" condition, a low-light "on" condition and a high-light "on" condition, the load control processor associated with each such load is configured to properly place that specific load in the desired one of the plurality of possible energy consumption states.

In our preferred embodiment, each of the Mxn loads is a latching relay associated with either the on-off function or a high lighting level/low lighting level function of each one of a plurality (Mxn/2) of lighting fixtures provided in at least one building to be controlled by our novel system. The number of fixtures controlled by a single LCP is related both to the number of states of energy consumption definable per fixture; the number of bits in a data word defined for the particular CPU utilized in computer facility 12; and the number of function words to be transmitted in a single message to the paralleled plurality of LCPs. In the embodiment herein illustrated, the INTEL MDS-800 microcomputer utilizes the well-known 8080 CPU integrated circuit, for which the data word is defined as being 8 bits (1 byte) wide. We have arbitrarily chosen to send only two data words be sent in serial fashion to each uniquely addressed one of the LCPs; each lighting fixture requires information contained in two binary data bits (the "on-off" function bit and the "high-low" function bit) whereby the "on/off" states of a set of eight fixtures are controlled by a first data byte and the "on-hi/on-lo" states of the eight fixtures are controlled by the second byte of the preferred two-byte sequential data function message. Of course, it should be understood that other CPUs may be utilized, whereby a particular data word may have more or less bits and that a single data word, or more than two data words in succession, may be as easily transmitted to the paralleled multiplicity of LCPs; other microprocessors CPUs are well known to the art, having four, twelve or sixteen bit data words, and minicomputers and large mainframe computers having data words up to at least sixty-four bits are also known-these CPUs may be utilized within the intent and spirit of the present invention. It should also be understood that other specific load control coding arrangements may be utilized, e.g. a lighting load having an "off" and three "on" conditions (such as a common three-way incandescent bulb and fixture therefor), which four energy utilization state combinations may be coded with the appropriate ones of the four possible combinations available from two sequential binary digits.

Similarly, other common non-lighting types of energy consumption loads may be controlled to a lesser or greater degree of possible states, e.g. air conditioning duct dampers may be controlled to one of eight air-flow positions, including zero air flow, by suitable choice of combination of three binary digits in a data word, and so forth.

Referring now to FIG. 2, interface driver circuit 40 couples to the preferred twisted-pair media 45 both a data signal, having a binary one level of about +V volts and a binary zero level of about 0, or ground potential, volts as well as a power saver (PSVR) signal which is a negative voltage of about −V volts for the purpose of turning off a major part of each load control processor 50. Each of the data and powersaver signals is received by an identical input section 101a or 101b, utilizing optical coupling techniques between a current-limited photodiode 102a or 102b and an associated phototransistor 103a and 103b. The emitters of both phototransistors 103 are coupled to the negative potential (−V) bus 104, while the collector of the first phototransistor 103a is coupled via a load resistor 105a to the positive potential (+V) bus 106, and the collector of the second phototransistor 103b is coupled via another load resistor 105b to the ground bus 107. The collector of each phototransistor is coupled through a DC amplifier transistor 108a and 108b, respectively, with its associated load resistance 109a and 109b, respectively, to provide isolated and amplified data and power saver signals $e_d$ and $e_p$, respectively, to the media driving circuitry 110 and powersaver driving circuitry 111.

In the absence of a PSVR input, driving voltage $e_d$ is coupled to the input of the Darlington amplifier 114 coupled between the positive bus 106 and output resistor 115. The driving signal is also coupled via emitter follower 117 (comprised of transistor 117a, base resistor 117b, Zener diode 117c and emitter resistor 117d) to an output stage 118, comprised of a transistor 118a, its base resistor 118b and a collector diode 118c, with the collector diode-transistor collector-emitter circuit coupled across output load 115. A binary one (positive true) signal at input 110a causes Darlington amplifier 114 to saturate, while causing transistors 117a and 118a to enter the cut-off state, whereby the interface means output 40c is forced to a voltage approximating the $+V$ potential, in logic one condition. When a data zero signal appears at data input 40a, a logic zero signal appears at amplifier input 110a, driving Darlington 114 to the cut-off state and allowing the voltage at output 40c to fall to approximately ground potential. The foregoing is true if the powersaver input 40b does not have a powersaver signal present, whereby the input voltage $e_p$ at both the powersaver amplifier input 111a and the data amplifier auxiliary input 110b is a binary zero level of approximately $-V$ volts, cutting off the powersaver amplifier Darlington transistors 111b and 111c to prevent any interaction thereby with the data levels across output load 115. The large negative voltage at auxiliary data amplifier input 110b biases the associated transistor 119, via its base resistor 119a, into the cut-off condition, whereby transistor 119 does not affect the voltage at data amplifier input 110a.

When a powersaver signal is present at powersaver input 40b, the signal $e_p$ has a binary one voltage of approximately ground potential. This ground potential at powersaver amplifier input 111a causes saturation of the Darlington transistors 111b and 111c and pulls the interface means output 40c to the negative voltage $-V$. Simultaneously, transistor 119 is saturated, placing a negative voltage signal at data amplifier input 110a to place both the Darlington output circuit 114 and the pull-down transistor 118a in their respective cut-off conditions, removing all influence thereof on the voltage state of the output. Collector diode 118c is now utilized to prevent damage at the collector electrode of the reverse-biased transistor 118a. Thus, it is seen that the PSVR signal takes precedence over all data signals and prevents transmission of the latter over the system media 45.

The data input to interface driver circuit 40 may be best understood by referring now to FIG. 3. When data is present, data is transmitted to the receivers/decoders, of the individual load control processors, over the dedicated two-wire transmission link at a high data transfer rate of about 2400 bits per second, with a high noise immunity being achieved by utilizing a complementary-redundant error-detecting code. The data transmission format thus transmits the two-byte address code commencing with the low-order byte (as required by the particular data format of the 8080 microprocessor utilized in the illustrated embodiment) which low-order byte is first transmitted as 8 bits of complementary data in time interval $T_1$ and is followed by the eight bits of the low order address byte transmitted as true (or non-complemented) data in time interval $T_2$. The high order eight-bit address byte follows with the complement of the eight data bits being first transmitted in time interval $T_3$ and followed by the eight bits of the high order byte transmitted in data-true manner in the fourth time interval $T_4$. Thus, if the sixteen-bit address of a particular receiver/decoder to be addressed is $47AF_H$, or 0100011110101111 in binary, the transmitted address will be 01010000 in time interval $T_1$ (the complement of the low order byte), followed by the eight bit true low-order byte 10101111, in time interval $T_2$, followed by the high-order byte complement eight-bit pattern 10111000, in time interval $T_3$ and ending the address portion of the transmission with the high order byte data-true eight-bit pattern 01000111. The following two bytes of data are also transmitted with the low-byte in complementary form during time interval $T_5$ followed by the low-order byte in true-data form during time interval $T_6$, and then the high-order byte in complementary data form during interval $T_7$ with the true-data representation of the high order bit following time interval $T_8$. A few random data bits are transmitted during a shortened time interval $T_9$ to act as a reset at the end of the address-data transmission. The output of the interface driver circuit 40 is coupled to media 45.

Figure 4A:
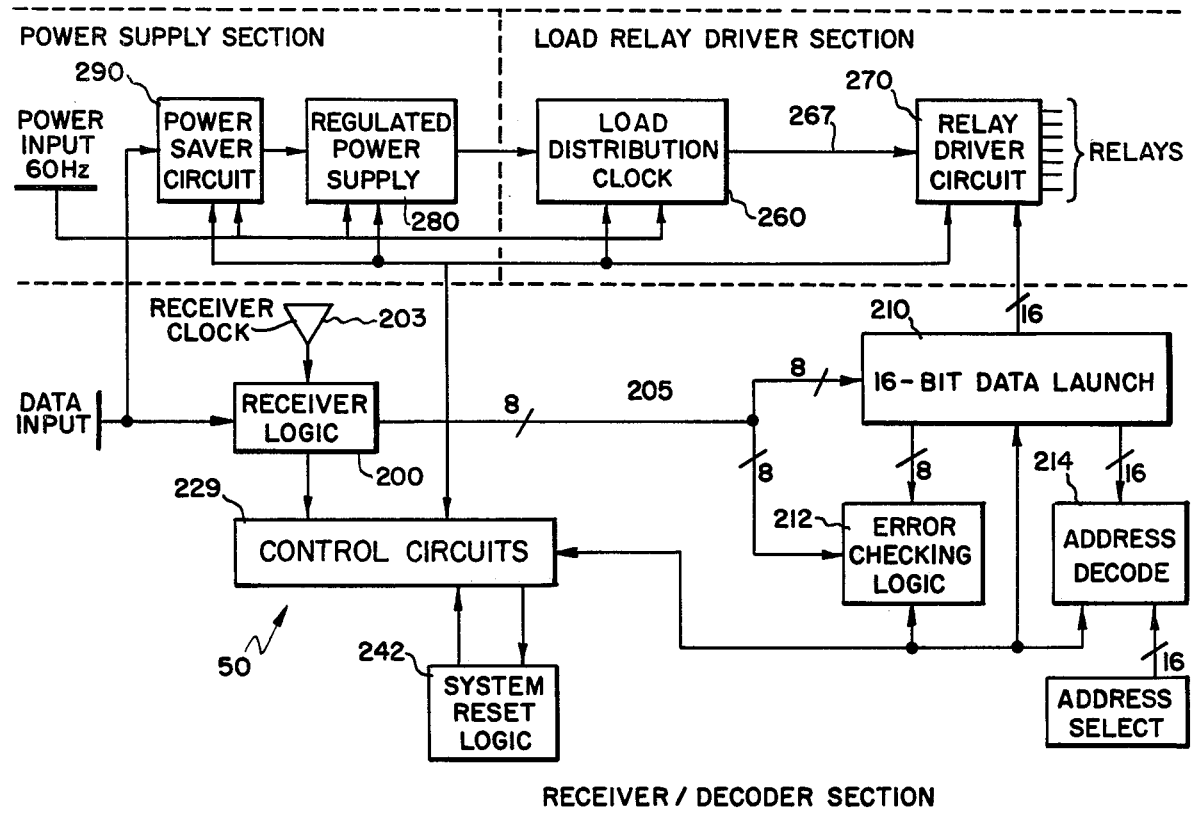
FIG. 4a is a block diagram of one embodiment of load control processer utilized with the interface driver circuit of FIG. 2.
Figure 4B:
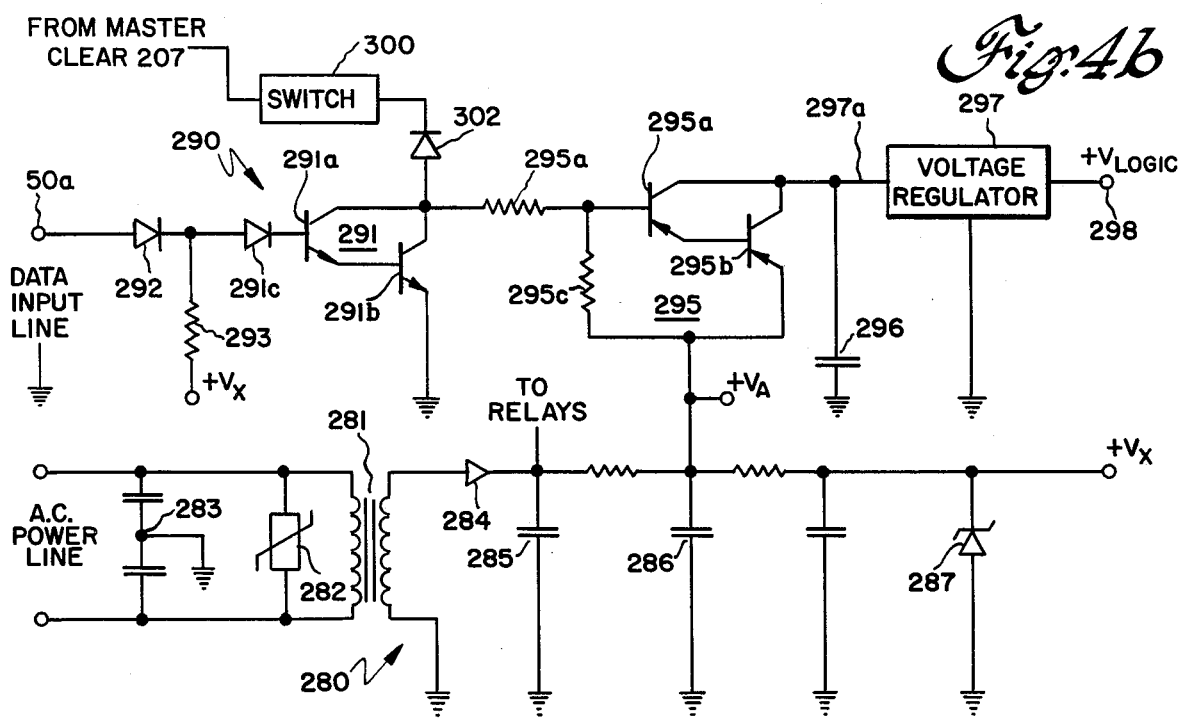
FIG. 4b is a schematic diagram of one embodiment of a powersaving-regulating power supply circuit utilizable in the load control processor.

Referring now to FIGS. 4a and 4b, the data input from transmission media 45 is received at each load control processor input 50a of the paralleled plurality of LCPs. The data is coupled to receiver logic circuitry 200, preferably comprised of some signal conditioning means, including low pass filtering means for removing high frequency interference from the incoming signal and means, such as a Schmitt trigger and the like, for restoring sharp leading and trailing bit edges.

Transmission of a PSVR signal to the paralleled receiver-decoders is considered with reference to FIG. 4b. Each load control processor 50 includes a power supply circuit 280 coupled to the AC power line and including a power transformer 281 and transient suppression means 282 and noise suppression means 283 generally located across the primary of transformer 281. Coupled to the secondary of transformer 281 is a rectifier means 284 and a filter means 285, yielding some DC voltage at the junction therebetween for coupling to the relays and relay driver circuits 270. Additional filtering 286 and overvoltage protection means 287 are utilized to establish two additional DC voltages $V_A$ and $V_X$, of positive polarity in the illustrated embodiment.

The powersaver circuit 290 includes a Darlington amplifier ,91, comprised of first and second Darlington transistors 291a and 291b, with a protection diode 291c having its cathode coupled to the base of transistor 291a. A Zener diode 292 has its anode coupled to data line input terminal 50a and its cathode coupled to the anode of signal diode 291c. A resistor 293 is coupled between the junction of diodes 291c and 292 and the $+V_X$ power supply output. A series-pass Darlington switch 295 includes Darlington pass transistors 295a and 295b coupled between the power supply $+V_A$ output and a filter capacitor 296, in parallel with the input terminal 297a of a voltage regulator 297. The power supply switch circuit 295 also includes a resistive biasing network comprised of resistors 295c and 295d, coupled between voltage $V_A$ and the output of the Darlington transistors 291. The output of the voltage regulator, at terminal 298 supplies the positive voltage necessary to operate the integrated circuits utilized to implement the logic of the LCP.

In operation, the data transmitted to LCP data input terminal 50a is of the positive-true type, i.e. a binary zero level generally corresponding to a voltage level of about zero volts and a binary-one logic level generally corresponding to some positive voltage level (typically on the order of +15 volts for CMOS logic). During normal data transmission, it will be seen that the voltage at terminal 50a is never less than zero, whereby the voltage on the anode of signal diode 291c, and hence across the base-emitter junctions of Darlington transistors 291a and 291b, is always positive. Hence, the Darlington transistor base-emitter junctions are forward biased and the magnitude of resistor 293 is adjusted to place the Darlington pair in saturation, with the result that the end of resistor 295d furthest from transistor 295a, is substantially at ground potential. The resistive divider comprised of resistors 295c and 295d is chosen such that the Darlington switch transistors 295a and 295b are in saturation whereby substantially the full magnitude of voltage $V_A$ appears at the input 297a of the voltage regulator. The magnitude of voltage $V_A$ is chosen to be larger than the required logic voltage $V_{LOGIC}$, such that regulator 297 operates and the proper logic voltage is available at output terminal 298 to allow proper operation of the LCP.

The Zener voltage of diode 292 is chosen such that when the negative magnitude PSVR signal is received, the sum of that negative voltage plus the positive Zener voltage is such that a negative voltage still appears at the anode of signal diode 291c. The base-emitter junctions of both Darlington transistors 291a and 291b are reverse-biased and the transistors are then in the cut-off condition, placing each of the Darlington transistors 295a and 295b also in the cut-off condition, whereby current does not flow to the input 297a of the voltage regulator. The magnitude of the logic voltage at regulator output 298 falls substantially to zero, and not only prevents operation of the receiver/decoder but also prevents any substantial power consumption by the circuitry of the LCP. As previously explained hereinabove, the negative DC voltage level utilized for the powersaver function is removed to again provide a non-negative voltage at data input 50a and allow the receiver/decoder logic circuitry to be re-powered and readied for subsequent receipt of new data transmissions.

While one presently preferred embodiment of the present invention has been disclosed herein, various modifications and variations will now become apparent to those skilled in the art. It is our intent, therefore, to be limited only by the appending claims and not by the specifics of the single embodiment presented herein.

What is claimed is:

1. An interface driver circuit for transmitting signals via a transmission medium, comprising:
   first input means for receiving a first logic signal of a first polarity;
   second means for receiving a second logic signal of said first polarity;
   an output;
   third means coupled between said first means and said output for driving said medium with the data of said first logic signal between first and second values of a voltage of said first polarity, said second means being coupled to said third means to cause said third means to be disabled whenever said second logic signal is received at said second means; and
   fourth means coupled between said second means and said output for driving said medium with the data of said second logic signal between said first and second values of a voltage of the remaining polarity.

2. The circuit as set forth in claim 1, wherein each of said first and second means include an optoelectronic isolator.

3. An interface driver circuit for transmitting signals via a transmission medium, comprising:
   first input means for receiving a first logic signal of a first polarity;
   second means for receiving a second logic signal of said first polarity;
   an output;
   third means including first and second potential sources of differing magnitudes and of said first polarity;
   first semiconductor switch means coupled between said first potential source and said output;
   second semiconductor switch means coupled between said second potential source and said output; and
   means for causing said first and second semiconductor switch means to respectively couple the associated one of said first and second sources of potential to said output dependent upon the state of the logic signal received at said first means, for driving said medium with the data of said first logic signal between first and second values of a voltage of said first polarity;
   said second means being coupled to said third means to cause said third means to be disabled whenever said second logic signal is received at said second means; and
   fourth means coupled between said second means and said output for driving said medium with the data of said second logic signal between said first and second values of a voltage of the remaining polarity.

4. The circuit as set forth in claim 1, wherein said third means further includes third semiconductor switch means coupled between said second means and said first means for preventing said first and second semiconductor switch means from operating if the second logic signal is present at said second means.

5. The circuit of claim 4, wherein said fourth means comprises a source of a third potential and of said remaining polarity; and
   semiconductor switch means coupled between said second means and said output for coupling said potential of said remaining polarity to said output when the second logic signal is received by said second means, regardless of the condition of said first signal.

6. A circuit as set forth in claim 1, wherein said third and fourth means are adapted to drive a transmission medium comprising a twisted pair of wires.

* * * * *